United States Patent
Li

(10) Patent No.: US 10,811,486 B2
(45) Date of Patent: Oct. 20, 2020

(54) WIRING STRUCTURE IN BENDING AREA AND DISPLAY DEVICE HAVING SAME

(71) Applicant: WUHAN CHINA STAR OPTOELECTRONICS SEMICONDUCTOR DISPLAY TECHNOLOGY CO., LTD., Wuhan, Hubei (CN)

(72) Inventor: Xue Li, Hubei (CN)

(73) Assignee: WUHAN CHINA STAR OPTOELECTRONICS SEMICONDUCTOR DISPLAY TECHNOLOGY CO., LTD, Wuhan, Hubei (CN)

( * ) Notice: Subject to any disclaimer, the term of this patent is extended or adjusted under 35 U.S.C. 154(b) by 0 days.

(21) Appl. No.: 16/342,536

(22) PCT Filed: Mar. 18, 2019

(86) PCT No.: PCT/CN2019/078507
§ 371 (c)(1),
(2) Date: Apr. 17, 2019

(87) PCT Pub. No.: WO2020/113848
PCT Pub. Date: Jun. 11, 2020

(65) Prior Publication Data
US 2020/0303484 A1 Sep. 24, 2020

(51) Int. Cl.
*G09G 3/30* (2006.01)
*H01L 27/32* (2006.01)
*H01L 51/52* (2006.01)
*H01L 51/00* (2006.01)

(52) U.S. Cl.
CPC ...... *H01L 27/3276* (2013.01); *H01L 51/0097* (2013.01); *H01L 51/5237* (2013.01)

(58) Field of Classification Search
CPC ... G09G 2300/0408; G09G 2300/0426; G09G 2310/0278; G09G 3/3266; G09G 3/3275; H01L 2251/5315; H01L 2251/533; H01L 27/3276
See application file for complete search history.

(56) References Cited

U.S. PATENT DOCUMENTS

| | | | |
|---|---|---|---|
| 2017/0075464 A1 | 3/2017 | Ahn | |
| 2018/0194969 A1* | 7/2018 | An | B32B 7/06 |
| 2018/0211975 A1 | 7/2018 | Long | |
| 2019/0057658 A1 | 2/2019 | Nie et al. | |
| 2019/0074328 A1* | 3/2019 | Park | G06F 3/0446 |

FOREIGN PATENT DOCUMENTS

| | | |
|---|---|---|
| CN | 103163669 A | 6/2013 |
| CN | 206574712 U | 10/2017 |
| CN | 107481666 A | 12/2017 |
| CN | 207116427 U | 3/2018 |
| CN | 108172122 A | 6/2018 |

* cited by examiner

*Primary Examiner* — Insa Sadio
(74) *Attorney, Agent, or Firm* — Soroker Agmon Nordman

(57) ABSTRACT

The present disclosure provides a wiring structure in a bending area and a display device having same. The wiring structure includes a substrate, a first organic protection layer, a first metal layer, and a second organic protection layer. The first metal layer is disposed on the first organic protection layer. The second organic protection layer is disposed on the first metal layer, and fills a gap between the signal lines.

15 Claims, 3 Drawing Sheets

WIRING STRUCTURE IN BENDING AREA AND DISPLAY DEVICE HAVING SAME

FIELD OF INVENTION

The present disclosure relates to a field of display technology, and more particularly to a wiring structure in a bending area and a display panel having same.

BACKGROUND

Because organic light emitting display (OLED) display devices are light in weight, flexible, and portable, OLED display devices attract users' attention. OLED display devices with "full screen" designs have become mainstream in recent years, and display panels are thus required to have narrower edge frames. However, edge frames at a bottom side of panels have a greater width than the other three sides of panels because of integrated circuits (ICs) and flexible print circuits (FPCs) disposed therein. This does not help in fulfilling "full screen" designs.

For this reason, flexible OLED display devices nowadays include a bending area in order to have an area outside of the bending area (where fan-out electrical lines, ICs, FPCs, and etc. are disposed) being bent to a backside of panels, and thus make the bottom side of panels to have narrow edge frames. However, this requires wiring structures in the bending area to have excellent anti-bend properties; otherwise, the wiring structures will rupture and a malfunction will occur during bending process, affecting driving of display panels.

In summary, because in conventional flexible display devices, metal wirings in the bending area have poor anti-bend properties and are liable to rupture, there is a need to provide a wiring structure in the bending area of flexible display devices in order to solve problems existing in prior art.

SUMMARY OF DISCLOSURE

The present disclosure provides a wiring structure in a bending area in order to solve the problems existing in prior art, where metal wirings in bending area have poor anti-bend properties and are liable to rupture.

To solve the aforementioned problems, the present disclosure provides wiring structure in a bending area, comprising:

a substrate;

a first organic protection layer disposed on the substrate;

a first metal layer disposed on the first organic protection layer, wherein the first metal layer includes a plurality of signal line units spaced apart from each other, each of the signal line units includes at least two signal lines parallel to each other, and any two adjacent signal lines are connected to each other; and a second organic protection layer disposed on the first metal layer and filling a gap between the signal lines.

In accordance with one embodiment of the present disclosure, in each signal line unit, any two adjacent connection portions for connecting two adjacent signal lines are positioned to have a staggered arrangement.

In accordance with one embodiment of the present disclosure, the signal lines in a same signal line unit are connected to each other at both ends of the first organic protection layer, and the signal lines in the same signal line unit transmit a same signal.

In accordance with one embodiment of the present disclosure, the wiring structure further comprises a second metal layer and a third organic protection layer.

In accordance with one embodiment of the present disclosure, the second metal layer is disposed on the first metal layer, the third organic protection layer is sandwiched between the first metal layer and the second metal layer and fills a gap between the signal lines.

In accordance with one embodiment of the present disclosure, the third organic protection layer includes a through-hole, and the first metal layer and the second metal layer are connected to each other via the through-hole to constitute a same signal line unit.

In accordance with one embodiment of the present disclosure, the signal lines in the same signal line unit are connected to each other at both ends of the first organic protection layer and at both ends of the third organic protection layer.

In accordance with one embodiment of the present disclosure, the wiring structure further comprises a barrier layer sandwiched between the substrate and the first organic protection layer.

In accordance with one embodiment of the present disclosure, the wiring structure satisfies the following relationships: 15 μm≤a≤20 μm, 9 μm≤b≤15 μm, 3 μm≤c≤5 μm, and 3 μm≤d≤5 μm, where a is an interval between one side of a signal line unit and one correspondingly same side of an adjacent signal line unit, b is a width of the signal line units, c is a width of the signal lines, and d is an interval between two adjacent signal lines.

The present disclosure further provides a display device having a wiring structure in a bending area, wherein the wiring structure in the bending area comprises:

a substrate;

a first organic protection layer disposed on the substrate;

a first metal layer disposed on the first organic protection layer, wherein the first metal layer includes a plurality of signal line units spaced apart from each other, each of the signal line units includes at least two signal lines parallel to each other, and any two adjacent signal lines are connected to each other; and a second organic protection layer disposed on the first metal layer and filling a gap between the signal lines.

In accordance with one embodiment of the present disclosure, in each signal line unit, any two adjacent connection portions for connecting two adjacent signal lines are positioned to have a staggered arrangement.

In accordance with one embodiment of the present disclosure, the signal lines in a same signal line unit are connected to each other at both ends of the first organic protection layer, and the signal lines in the same signal line unit transmit a same signal.

In accordance with one embodiment of the present disclosure, the wiring structure further comprises a second metal layer and a third organic protection layer.

In accordance with one embodiment of the present disclosure, the second metal layer is disposed on the first metal layer, the third organic protection layer is sandwiched between the first metal layer and the second metal layer and fills a gap between the signal lines.

In accordance with one embodiment of the present disclosure, the third organic protection layer includes a through-hole, and the first metal layer and the second metal layer are connected to each other via the through-hole to constitute a same signal line unit.

In accordance with one embodiment of the present disclosure, the signal lines in the same signal line unit are connected to each other at both ends of the first organic protection layer and at both ends of the third organic protection layer.

In accordance with one embodiment of the present disclosure, the wiring structure further comprises a barrier layer sandwiched between the substrate and the first organic protection layer.

In accordance with one embodiment of the present disclosure, the wiring structure satisfies the following relationships: 15 µm≤a≤20 µm, 9 µm≤b≤15 µm, 3 µm≤c≤5 µm, and 3 µm≤d≤5 µm, where a is an interval between one side of a signal line unit and one correspondingly same side of an adjacent signal line unit, b is a width of the signal line units, c is a width of the signal lines, and d is an interval between two adjacent signal lines.

Advantageous Effects

The present disclosure is characterized by replacing one single signal line with a plurality of signal lines parallel to each other, wherein lateral connection portions are formed between any two adjacent signal lines, and the signal lines are connected to each other at both ends thereof. Therefore, the signals can be transmitted among the signal lines in a same signal line unit, and merge at ends of the signal line unit, thus ensuring delivery stability of signals. In addition, organic protection layers are disposed above and below the signal lines to protect the metal layer where the signal lines are disposed, thus ensuring anti-bend properties of the bending area of display devices.

BRIEF DESCRIPTION OF DRAWINGS

To detailedly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
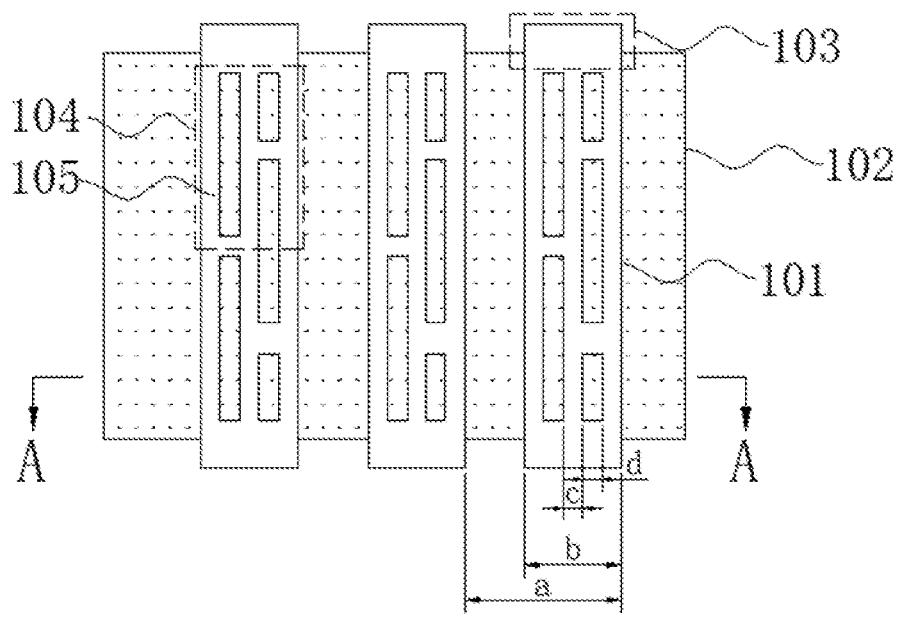
FIG. 1 shows a top view of a wiring structure in a bending area.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Embodiments of the present invention will now be described in detail below and with reference to the drawings.

Embodiment One

The present embodiment provides a wiring structure in a bending area. Description thereof is provided below with reference to FIGS. 1 and 2.

FIG. 1 shows a top view of a wiring structure in a bending area according to the present embodiment. The wiring structure includes a first metal layer 101 and a first organic protection layer 102. The first metal layer 101 is disposed on the first organic protection layer 102. The first metal layer 101 includes a plurality of signal line units 104 spaced apart from each other, wherein each of the signal line units 104 includes at least two signal lines parallel to each other.

In the present embodiment, each of the signal line units 104 is composed of three signal lines 105. Any two adjacent signal lines 105 are connected to each other by lateral connection portions perpendicular to an extending direction of the signal lines. Any two adjacent connection portions for connecting two adjacent signal lines are positioned to have a staggered arrangement. The three signal lines 105 in a same signal line unit 104 are connected to each other at both ends of the first organic protection layer 102 along the extending direction of the signal lines, so as to constitute an edge unit 103. Such a design achieves the effect that signals are transmitted among the three signal lines. Even if one signal line ruptures, the signals can still be transmitted by the other two signal lines and merge at the end of the signal line unit, and thus the signals are delivered to effective display areas of display devices. This ensures delivery of signals.

As shown in FIG. 1, a is an interval between one side of a signal line unit 104 and one correspondingly same side of an adjacent signal line unit 104, b is a width of the signal line units 104, c is a width of the signal lines 105, and d is an interval between two adjacent signal lines 105. In the present embodiment, the intervals between any two adjacent signal lines 105 are the same. The intervals between any two adjacent signal line units 104 are the same as well. The wiring structure satisfies the following relationships: 15 µm≤a≤20 µm, 9 µm≤b≤15 µm, 3 µm≤c≤5 µm, and 3 µm≤d≤5 µm.

Figure 2:
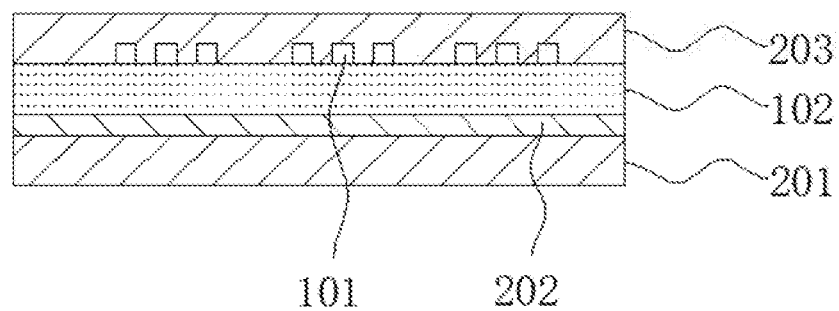
FIG. 2 shows a cross-sectional view of the wiring structure taken along a line A-A.

Please refer to FIG. 2. FIG. 2 shows a cross-sectional view of a wiring structure taken along a line A-A. The wiring structure in the bending area further includes a substrate 201, a barrier layer 202, and a second organic protection layer 203. The barrier layer 202 is disposed on the substrate 201. The first organic protection layer 102 is disposed on the barrier layer 202. The second organic protection layer 203 is disposed on the first metal layer 101 and fills a gap between the signal lines 105.

In the present embodiment, organic protection layers are disposed above and below the first metal layer 101 to protect the first metal layer 101. This further enhances anti-bend properties of the metal wirings in the bending area.

In the present embodiment, the signal lines 105 have a stacking three-layered composite structure including Ti/A/Ti layers. The barrier layer 202 positioned between the substrate 201 and the first organic protection layer 102 is configured to protect organic light emitting diode (OLED) devices by preventing water and oxygen from entering OLED devices.

Embodiment Two

The present embodiment provides a wiring structure in a bending area. Description thereof is provided below with reference to FIGS. 3-6.

Figure 3:
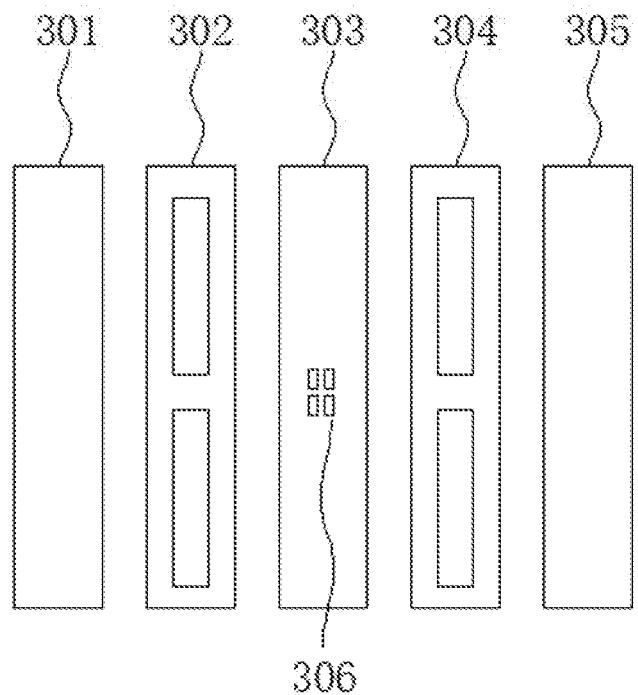
FIG. 3 is a schematic diagram showing a wiring structure in the bending area according to a second structural design.

The present embodiment provides a wiring structure in a bending area. As shown in FIG. 3, the wiring structure includes a first organic protection layer 301, a first metal layer 302, a third organic protection layer 303, a second metal layer 304, and a second organic protection layer 305. The third organic protection layer 303 includes through-holes 306 formed therein.

Figure 4:
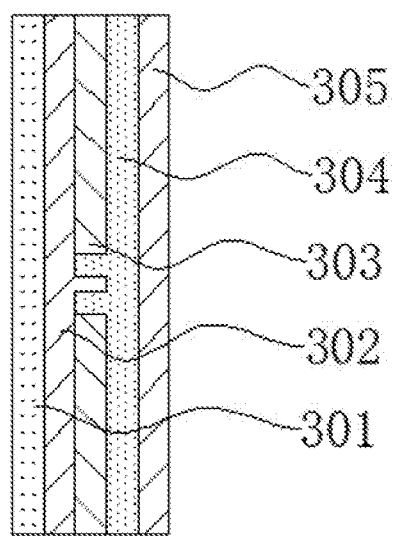
FIG. 4 shows a cross-sectional view of the wiring structure taken along a wiring extending direction according to the second structural design.

Please refer to FIG. 4, which shows a cross-sectional view of the wiring structure taken along a wiring extending direction according to a second structural design. The first metal layer 302 is disposed on the first organic protection layer 301. The third organic protection layer 303 is sandwiched between the first metal layer 302 and the second metal layer 304. The first metal layer 302 and the second metal layer 304 are connected to each other via the through-holes (not shown) formed in the third organic protection layer 303. The second organic protection layer 305 is disposed on the second metal layer 304.

In the present embodiment, the through-holes 306 are composed of four same-sized holes that are rectangle-shaped in cross-section and pass through the third organic protection layer 303. In other embodiments, size, quantity, and shape of the through-holes 306 can be adjusted based on actual needs.

Figure 5:
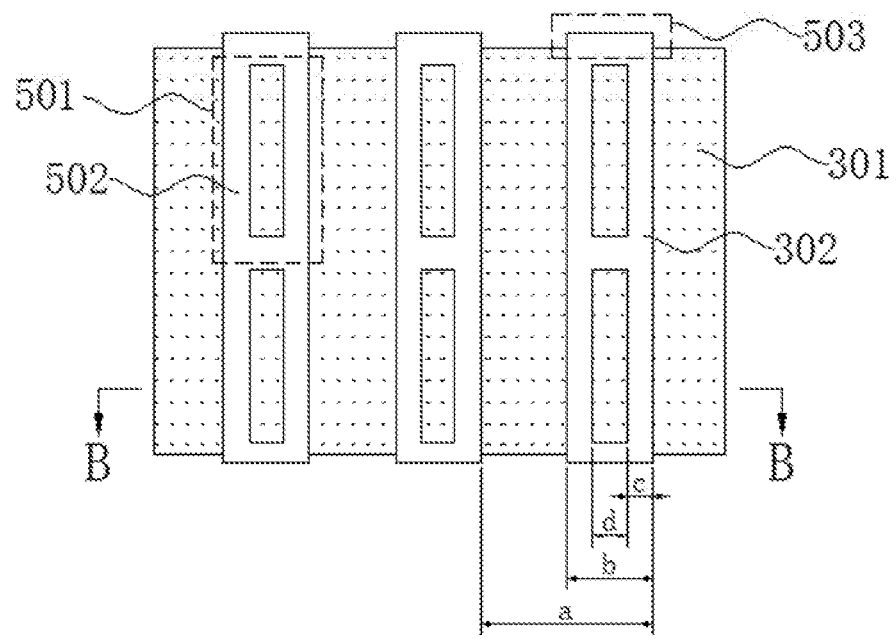
FIG. 5 shows a top view of the wiring structure in the bending area according to the second structural design.

FIG. 5 shows a top view of the wiring structure in the bending area according to the second structural design. In FIG. 5, only the first metal layer 302 disposed on the first organic protection layer is shown. The second metal layer 304 has the same structural design as that of the first metal layer 302, and thus is omitted in FIG. 5. The first metal layer 302 includes a plurality of signal line units 501 spaced apart from each other. The intervals between any two adjacent signal line units 501 are the same. Each of the signal line units 501 includes two signal lines 502 parallel to each other. Connection portions are formed between the two signal lines 502. Quantity of connection portions could be adjusted based on length of the signal lines. The two signal lines 502 in a same signal line unit 501 are connected to each other at both ends of the first organic protection layer 301 along the extending direction of the signal lines, so as to constitute an edge unit 503. The signals transmitted via the two signal lines merge at the edge unit 503, and are delivered to an effective display area of flexible display devices.

Figure 6:
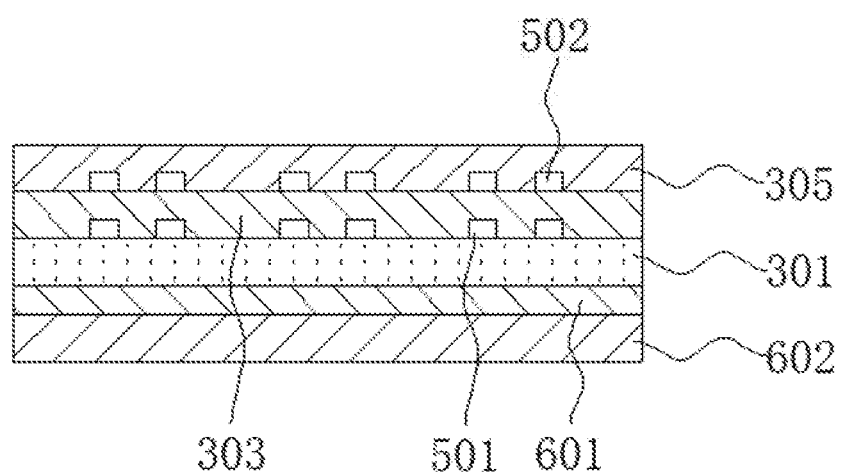
FIG. 6 shows a cross-sectional view of the wiring structure taken along a line B-B according to the second structural design.

FIG. 6 shows a cross-sectional view of a wiring structure taken along a line B-B according to the second structural design. The wiring structure further includes a barrier layer 601 disposed below the first organic protection layer 301, and a substrate 602 disposed below the barrier layer 601. As shown, both the signal lines 502 disposed at two different layers and connected to each other via the through-holes 306 transmit the same signals. That is, the same signals can be transmitted by four signal lines. Even if one signal line ruptures, the other three signal lines are still electrically conductive. This further ensures delivery of signals. In addition, organic protection layers are disposed above and below both the first metal layer 302 and the second metal layer 304 to protect both the first metal layer 302 and the second metal layer 304. This further raises anti-bend properties of the metal wirings in the bending area.

In the present embodiment, a is an interval between one side of a signal line unit 501 and one correspondingly same side of an adjacent signal line unit 501, b is a width of the signal line units 501, c is a width of the signal lines 502, and d is an interval between two adjacent signal lines 502. In the present embodiment, the intervals between any two adjacent signal lines 502 are the same. The intervals between any two adjacent signal line units 501 are the same as well. The wiring structure satisfies the following relationships: $15\ \mu m \leq a \leq 20\ \mu m$, $9\ \mu m \leq b \leq 15\ \mu m$, $3\ \mu m \leq c \leq 5\ \mu m$, and $3\ \mu m \leq d \leq 5\ \mu m$.

Embodiment Three

The present embodiment provides a display device. Description thereof is provided below with reference to FIGS. 1 and 2.

FIG. 1 shows a top view of a wiring structure in a bending area, where the wiring structure is included in a display device according to the present embodiment. The wiring structure includes a first metal layer 101 and a first organic protection layer 102. The first metal layer 101 is disposed on the first organic protection layer 102. The first metal layer 101 includes a plurality of signal line units 104 spaced apart from each other, wherein each of the signal line units 104 includes at least two signal lines parallel to each other.

In the present embodiment, each of the signal line units 104 is composed of three signal lines 105. Any two adjacent signal lines 105 are connected to each other by lateral connection portions perpendicular to an extending direction of the signal lines. Any two adjacent connection portions for connecting two adjacent signal lines are positioned to have a staggered arrangement. The three signal lines 105 in a same signal line unit 104 are connected to each other at both ends of the first organic protection layer 102 along the extending direction of the signal lines, so as to constitute an edge unit 103. Such a design achieves the effect that signals are transmitted among the three signal lines. Even if one signal line ruptures, the signals can still be transmitted by the other two signal lines and merge at the end of the signal line unit, and thus the signals are delivered to an effective display area of display devices. This ensures delivery of signals.

As shown in FIG. 1, a is an interval between one side of a signal line unit 104 and one correspondingly same side of an adjacent signal line unit 104, b is a width of the signal line units 104, c is a width of the signal lines 105, and d is an interval between two adjacent signal lines 105. In the present embodiment, the intervals between any two adjacent signal lines 105 are the same. The intervals between any two adjacent signal line units 104 are the same as well. The wiring structure satisfies the following relationships: $15\ \mu m \leq a \leq 20\ \mu m$, $9\ \mu m \leq b \leq 15\ \mu m$, $3\ \mu m \leq c \leq 5\ \mu m$, and $3\ \mu m \leq d \leq 5$ Nm.

Please refer to FIG. 2. FIG. 2 shows a cross-sectional view of a wiring structure taken along a line A-A. The wiring structure in the bending area further includes a substrate 201, a barrier layer 202, and a second organic protection layer 203. The barrier layer 202 is disposed on the substrate 201. The first organic protection layer 102 is disposed on the barrier layer 202. The second organic protection layer 203 is disposed on the first metal layer 101, and fills a gap between the signal lines 105.

In the present embodiment, organic protection layers are disposed above and below the first metal layer 101 to protect the first metal layer 101. This further enhances anti-bend properties of the metal wirings in the bending area.

In the present embodiment, the signal lines 105 have a stacking three-layered composite structure including Ti/Al/Ti layers. The barrier layer 202 positioned between the substrate 201 and the first organic protection layer 102 is configured to protect OLED devices by preventing water and oxygen from entering OLED devices.

Embodiment Four

The present embodiment provides a display device. Description thereof is provided below with reference to FIGS. 3-6.

The present embodiment provides a wiring structure in a bending area, where the wiring structure is included in the display device. As shown in FIG. 3, the wiring structure includes a first organic protection layer 301, a first metal layer 302, a third organic protection layer 303, a second metal layer 304, and a second organic protection layer 305. The third organic protection layer 303 includes through-holes 306 formed therein.

Please refer to FIG. 4, which shows a cross-sectional view of the wiring structure taken along a wiring extending direction according to the second structural design. The first metal layer 302 is disposed on the first organic protection layer 301. The third organic protection layer 303 is sandwiched between the first metal layer 302 and the second metal layer 304. The first metal layer 302 and the second metal layer 304 are connected to each other via the through-holes (not shown) formed in the third organic protection layer 303. The second organic protection layer 305 is disposed on the second metal layer 304.

In the present embodiment, the through-holes 306 are composed of four same-sized holes that are rectangle-shaped in cross-section and pass through the third organic protection layer 303. In other embodiments, size, quantity, and shape of the through-holes 306 can be adjusted based on actual needs.

FIG. 5 shows a top view of the wiring structure in the bending area according to the second structural design. In FIG. 5, only the second metal layer 302 disposed on the first organic protection layer is shown. The second metal layer 304 has the same structural design as that of the first metal layer 302, and thus is omitted in FIG. 5. The first metal layer 302 includes a plurality of signal line units 501 spaced apart from each other. The intervals between any two adjacent signal line units 501 are the same. Each of the signal line units 501 includes two signal lines 502 parallel to each other. Connection portions are formed between the two signal lines 502. Quantity of connection portions could be adjusted based on length of the signal lines. The two signal lines 502 in a same signal line unit 501 are connected to each other at both ends of the first organic protection layer 301 along an extending direction of the signal lines, so as to constitute an edge unit 503. The signals transmitted via the two signal lines merge at the edge unit 503, and are delivered to an effective display area of flexible display devices.

FIG. 6 shows a cross-sectional view of the wiring structure taken along a line B-B according to the second structural design. The wiring structure further includes a barrier layer 601 disposed below the first organic protection layer 301, and a substrate 602 disposed below the barrier layer 601. As shown, both the signal lines 502 disposed at two different layers and connected to each other via the through-holes 306 transmit the same signals. That is, the same signals can be transmitted by four signal lines. Even if one signal line ruptures, the other three signal lines are still electrically conductive. This further ensures delivery of signals. In addition, organic protection layers are disposed above and below both the first metal layer 302 and the second metal layer 304 to protect both the first metal layer 302 and the second metal layer 304. This further raises anti-bend properties of the metal wirings in the bending area.

In the present embodiment, a is an interval between one side of a signal line unit 501 and one correspondingly same side of an adjacent signal line unit 501, b is a width of the signal line units 501, c is a width of the signal lines 502, and d is an interval between two adjacent signal lines 502. In the present embodiment, the intervals between any two adjacent signal lines 502 are the same. The intervals between any two adjacent signal line units 501 are the same as well. The wiring structure satisfies the following relationships: 5 µm≤a≤20 µm, 91 µm≤b≤15 µm, 3 µm≤c≤5 µm, and 3 µm≤d≤5 µm.

The present disclosure is characterized by replacing one single signal line with a plurality of signal lines parallel to each other, wherein lateral connection portions are formed between any two adjacent signal lines, and the signal lines are connected to each other at both ends thereof. Therefore, the signals can be transmitted among the signal lines in a same signal line unit, and merge at ends of the signal line unit, thus ensuring stable delivery of signals. In addition, organic protection layers are disposed above and below the signal lines to protect the metal layer where the signal lines are disposed, thus ensuring anti-bend properties of the bending area of display devices.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A wiring structure in a bending area, comprising:
a substrate;
a first organic protection layer disposed on the substrate;
a first metal layer disposed on the first organic protection layer, wherein the first metal layer includes a plurality of signal line units spaced apart from each other, each of the signal line units includes at least two signal lines parallel to each other, and any two adjacent signal lines are connected to each other, and
a second organic protection layer disposed on the first metal layer and filling a gap between the signal lines,
wherein the wiring structure satisfies the following relationships: 15 µm≤a≤20 µm, 9 µm≤b≤15 µm, 3 µm≤c≤5 µm, and 3 µm≤d≤5 µm,
where a is an interval between one side of a signal line unit and one correspondingly same side of an adjacent signal line unit, b is a width of the signal line units, c is a width of the signal lines, and d is an interval between two adjacent signal lines.

2. The wiring structure according to claim 1, wherein in each signal line unit, any two adjacent connection portions for connecting two adjacent signal lines are positioned to have a staggered arrangement.

3. The wiring structure according to claim 1, wherein the signal lines in a same signal line unit are connected to each other at both ends of the first organic protection layer, and the signal lines in the same signal line unit transmit a same signal.

4. The wiring structure according to claim 1, wherein the wiring structure further comprises a second metal layer and a third organic protection layer.

5. The wiring structure according to claim 4, wherein the second metal layer is disposed on the first metal layer, the third organic protection layer is sandwiched between the first metal layer and the second metal layer and fills a gap between the signal lines.

6. The wiring structure according to claim 5, wherein the third organic protection layer includes a through-hole, and the first metal layer and the second metal layer are connected to each other via the through-hole to constitute a same signal line unit.

7. The wiring structure according to claim 6, wherein the signal lines in the same signal line unit are connected to each other at both ends of the first organic protection layer and at both ends of the third organic protection layer.

8. The wiring structure according to claim 1, wherein the wiring structure further comprises a barrier layer sandwiched between the substrate and the first organic protection layer.

9. A display device having a wiring structure in a bending area, wherein the wiring structure in the bending area comprises:
   a substrate;
   a first organic protection layer disposed on the substrate;
   a first metal layer disposed on the first organic protection layer, wherein the first metal layer includes a plurality of signal line units spaced apart from each other, each of the signal line units includes at least two signal lines parallel to each other, and any two adjacent signal lines are connected to each other;
   a second organic protection layer disposed on the first metal layer and filling a gap between the signal lines;
   a second metal layer, disposed on the first metal layer; and
   a third organic protection layer, sandwiched between the first metal layer and the second metal layer and filling a gap between the signal lines.

10. The display device according to claim 9, wherein in each signal line unit, any two adjacent connection portions for connecting two adjacent signal lines are positioned to have a staggered arrangement.

11. The display device according to claim 9, wherein the signal lines in a same signal line unit are connected to each other at both ends of the first organic protection layer, and the signal lines in the same signal line unit transmit a same signal.

12. The display device according to claim 9, wherein the third organic protection layer includes a through-hole, and the first metal layer and the second metal layer are connected to each other via the through-hole to constitute a same signal line unit.

13. The display device according to claim 12, wherein the signal lines in the same signal line unit are connected to each other at both ends of the first organic protection layer and at both ends of the third organic protection layer.

14. The display device according to claim 9, wherein the wiring structure further comprises a barrier layer sandwiched between the substrate and the first organic protection layer.

15. The display device according to claim 9, wherein the wiring structure satisfies the following relationships: $15\ \mu m \leq a \leq 20\ \mu m$, $9\ \mu m \leq b \leq 15\ \mu m$, $3\ \mu m \leq c \leq 5\ \mu m$, and $3\ \mu m \leq d \leq 5\ \mu m$,
   where a is an interval between one side of a signal line unit and one correspondingly same side of an adjacent signal line unit, b is a width of the signal line units, c is a width of the signal lines, and d is an interval between two adjacent signal lines.

\* \* \* \* \*

UNITED STATES PATENT AND TRADEMARK OFFICE
CERTIFICATE OF CORRECTION

PATENT NO. : 10,811,486 B2  
APPLICATION NO. : 16/342536  
DATED : October 20, 2020  
INVENTOR(S) : Li Page 1 of 1

It is certified that error appears in the above-identified patent and that said Letters Patent is hereby corrected as shown below:

On the Title Page

Item (30) Foreign Application Priority Data  
Insert -- Dec 5, 2018 (CN) ................................. 201811476962.9 --

Signed and Sealed this  
Twenty-second Day of December, 2020

Andrei Iancu  
*Director of the United States Patent and Trademark Office*